(12) United States Patent
Yin et al.

(10) Patent No.: US 12,284,306 B2
(45) Date of Patent: Apr. 22, 2025

(54) DISPLAY PANEL AND METHOD FOR MANUFACTURING SAME, AND MOBILE TERMINAL

(71) Applicant: WUHAN CHINA STAR OPTOELECTRONICS SEMICONDUCTOR DISPLAY TECHNOLOGY CO., LTD., Wuhan (CN)

(72) Inventors: Bingkun Yin, Wuhan (CN); Li Hu, Wuhan (CN); You Zhang, Wuhan (CN); Liang Sun, Wuhan (CN)

( * ) Notice: Subject to any disclaimer, the term of this patent is extended or adjusted under 35 U.S.C. 154(b) by 0 days.

(21) Appl. No.: 17/599,626

(22) PCT Filed: Sep. 3, 2021

(86) PCT No.: PCT/CN2021/116490
§ 371 (c)(1),
(2) Date: Sep. 29, 2021

(87) PCT Pub. No.: WO2023/015633
PCT Pub. Date: Feb. 16, 2023

(65) Prior Publication Data
US 2024/0031464 A1    Jan. 25, 2024

(30) Foreign Application Priority Data
Aug. 11, 2021  (CN) .......................... 202110916585.1

(51) Int. Cl.
*H04M 1/02*     (2006.01)
*H10K 77/10*    (2023.01)
*G09F 9/30*     (2006.01)
*H10K 102/00*   (2023.01)

(52) U.S. Cl.
CPC .......... *H04M 1/0268* (2013.01); *H10K 77/10* (2023.02); *H10K 77/111* (2023.02); *G09F 9/301* (2013.01); *H10K 2102/311* (2023.02)

(58) Field of Classification Search
CPC ... H04M 1/0268; H10K 77/10; H10K 77/111; H10K 2102/311; G09F 9/301
USPC .................................. 428/1.1, 1.5, 1.52, 1.6
See application file for complete search history.

(56) References Cited

U.S. PATENT DOCUMENTS

2020/0119294 A1   4/2020  Kim et al.
2020/0243780 A1*  7/2020  Dong .................... H10K 71/00

FOREIGN PATENT DOCUMENTS

| CN | 109345959 A | 2/2019 |
| CN | 109599402 A | 4/2019 |
| CN | 109801881 A | 5/2019 |
| CN | 110649087 A | 1/2020 |

(Continued)

*Primary Examiner* — Ruiyun Zhang

(57) ABSTRACT

A display panel and a method for manufacturing the same, and a mobile terminal that include a substrate layer and a first elastic layer disposed on at least one side of the substrate layer and having an elastic modulus less than that of the substrate layer. The substrate layer includes a first part and a second part adjacently disposed to form a boundary line. An elastic modulus of the first part is less than an elastic modulus of the second part. A projection of the first elastic layer on the substrate layer covers the boundary line. The elastic modulus of the first elastic layer increases in a direction from the first part to the second part.

20 Claims, 6 Drawing Sheets

(56) References Cited

FOREIGN PATENT DOCUMENTS

| CN | 111653205 A | 9/2020 |
|----|-------------|--------|
| CN | 112310137 A | 2/2021 |

* cited by examiner

| Disposing a photomask opposite to the elastic film, wherein the photomask is provided with a plurality of hollow areas, and an area ratio of the hollow areas in a part of the photomask disposed opposite to the second part is greater than an area ratio of the hollow areas in a part of the photomask disposed opposite to the first part. |—S2021

| Irradiating the elastic film with the ultraviolet light through the photomask to form the first elastic layer. |—S2022

FIG. 8

| Disposing a slit plate opposite to the elastic film, wherein the slit plate is provided with a plurality of slits evenly distributed. |—S2023

| Irradiating the elastic film with the ultraviolet light through the slit plate to form the first elastic layer, wherein an irradiation time of the ultraviolet light passing through a part of the slit plate disposed opposite to the second part is greater than an irradiation time of the ultraviolet light passing through a part of the slit plate disposed opposite to the first part, or an irradiation intensity of the ultraviolet light passing through the part of the slit plate disposed opposite to the second part is greater than an irradiation intensity of the ultraviolet light passing through the part of the slit plate disposed opposite to the first part. |—S2024

FIG. 9

DISPLAY PANEL AND METHOD FOR MANUFACTURING SAME, AND MOBILE TERMINAL

FIELD OF INVENTION

The present disclosure relates to the technical field of display, particularly to manufacture of display devices, and more particularly to a display panel and a method for manufacturing the same, and a mobile terminal.

BACKGROUND

A stretchable display screen is a flexible display screen that can be stretched and bent.

The stretchable display screen needs to comprise an unstretchable area to install easily damaged devices such as driving devices. In order to avoid damage to the driving devices, the unstretchable area is unstretchable. However, there is a boundary between a stretchable area and the unstretchable area. A stretchability difference between regions on both sides of the boundary is too large, which causes lines at the boundary to break due to stress concentration when the stretchable display screen is stretched, thereby reducing working reliability of the stretchable display screen.

Therefore, it is necessary to provide a display panel and a method for manufacturing the same, and a mobile terminal that can reduce a risk of line breaking at the boundary in a stretched state.

SUMMARY OF DISCLOSURE

A purpose of the present disclosure is to provide a display panel and a method for manufacturing the same, and a mobile terminal, so as to solve a technical problem that lines at a boundary between a stretchable area and an unstretchable area are broken due to stress concentration caused by a large stretchability difference between regions on both sides of the boundary between the stretchable area and the unstretchable area when a stretchable display screen is stretched.

The present disclosure provides a display panel comprising:
  a substrate layer comprising a first part and a second part adjacently disposed, wherein the first part is provided with a plurality of holes, so that an elastic modulus of the first part is less than an elastic modulus of the second part; and
  a first elastic layer disposed on at least one of a side of the substrate layer away from a light-emitting surface and a side of the substrate layer close to the light-emitting surface, wherein a projection of the first elastic layer on the substrate layer covers a boundary line between the first part and the second part, an elastic modulus of the first elastic layer is less than an elastic modulus of the substrate layer, the elastic modulus of the first elastic layer increases in a first direction, and the first direction is a direction from the first part to the second part.

In an embodiment, the display panel further comprises a second elastic layer disposed on a same layer as the first elastic layer, and on a side of the first elastic layer close to a center of the display panel. An elastic modulus of the second elastic layer is less than the elastic modulus of the first elastic layer, and the elastic modulus of the second elastic layer is equal everywhere.

In an embodiment, the display panel further comprises a third elastic layer disposed on a same layer as the first elastic layer, and on a side of the first elastic layer away from a center of the display panel. An elastic modulus of the third elastic layer is greater than the elastic modulus of the first elastic layer, and the elastic modulus of the third elastic layer is equal everywhere.

In an embodiment, the projection of the first elastic layer on the substrate layer covers the substrate layer.

In an embodiment, the first elastic layer is made of polydimethylsiloxane.

In an embodiment, the first part is configured for screen display, and the second part is configured to dispose a driving circuit.

In an embodiment, the substrate layer is made of polyimide.

The present disclosure further provides a mobile terminal. The mobile terminal comprises a terminal main body part and a display panel integrated with the terminal main body part. The display panel comprises:
  a substrate layer comprising a first part and a second part adjacently disposed, wherein the first part is provided with a plurality of holes, so that an elastic modulus of the first part is less than an elastic modulus of the second part; and
  a first elastic layer disposed on at least one of a side of the substrate layer away from a light-emitting surface and a side of the substrate layer close to the light-emitting surface, wherein a projection of the first elastic layer on the substrate layer covers a boundary line between the first part and the second part, an elastic modulus of the first elastic layer is less than an elastic modulus of the substrate layer, the elastic modulus of the first elastic layer increases in a first direction, and the first direction is a direction from the first part to the second part.

In an embodiment, the display panel further comprises a second elastic layer disposed on a same layer as the first elastic layer, and a side of the first elastic layer close to a center of the display panel. An elastic modulus of the second elastic layer is less than the elastic modulus of the first elastic layer, and the elastic modulus of the second elastic layer is equal everywhere.

In an embodiment, the display panel further comprises a third elastic layer disposed on a same layer as the first elastic layer, and a side of the first elastic layer away from a center of the display panel. An elastic modulus of the third elastic layer is greater than the elastic modulus of the first elastic layer, and the elastic modulus of the third elastic layer is equal everywhere.

In an embodiment, the projection of the first elastic layer on the substrate layer covers the substrate layer.

In an embodiment, the first elastic layer is made of polydimethylsiloxane.

In an embodiment, the first part is configured for screen display, and the second part is configured to dispose a driving circuit.

In an embodiment, the substrate layer is made of polyimide.

The present disclosure further provides a method for manufacturing a display panel, which comprises:
  providing a substrate layer, wherein the substrate layer comprises a first part and a second part adjacently disposed, and the first part is provided with a plurality of holes, so that an elastic modulus of the first part is less than an elastic modulus of the second part; and
  forming a first elastic layer on at least one of a side of the substrate layer away from a light-emitting surface and a side of the substrate layer close to the light-emitting surface, wherein a projection of the first elastic layer on the substrate layer covers a boundary line between the first part and the second part, an elastic modulus of the first elastic layer is less than an elastic modulus of the substrate layer, the elastic modulus of the first elastic layer increases in a first direction, and the first direction is a direction from the first part to the second part.

In an embodiment, the providing the substrate layer comprises:

coating polyimide on a glass substrate to form a polyimide film; and drying the polyimide film to form the substrate layer.

In an embodiment, the forming the first elastic layer on at least one of the side of the substrate layer away from the light-emitting surface and the side of the substrate layer close to the light-emitting surface comprises:

forming an elastic film on at least one of the side of the substrate layer away from the light-emitting surface and the side of the substrate layer close to the light-emitting surface, wherein an elastic modulus of the elastic film is equal everywhere; and treating the elastic film with ultraviolet light to form the first elastic layer.

In an embodiment, the treating the elastic film with the ultraviolet light to form the first elastic layer comprises:

disposing a photomask opposite to the elastic film, wherein the photomask is provided with a plurality of hollow areas, and an area ratio of the hollow areas in a part of the photomask disposed opposite to the second part is greater than an area ratio of the hollow areas in a part of the photomask disposed opposite to the first part; and irradiating the elastic film with the ultraviolet light through the photomask to form the first elastic layer.

In an embodiment, the photomask is provided with a non-hollow area between every two adjacent hollow areas. In a first direction, sizes of the hollow areas increase, or sizes of the non-hollow areas decrease.

In an embodiment, the treating the elastic film with the ultraviolet light to form the first elastic layer comprises:

disposing a slit plate opposite to the elastic film, wherein the slit plate is provided with a plurality of slits evenly distributed; and irradiating the elastic film with the ultraviolet light through the slit plate to form the first elastic layer, wherein an irradiation time of the ultraviolet light passing through a part of the slit plate disposed opposite to the second part is greater than an irradiation time of the ultraviolet light passing through a part of the slit plate disposed opposite to the first part, or an irradiation intensity of the ultraviolet light passing through the part of the slit plate disposed opposite to the second part is greater than an irradiation intensity of the ultraviolet light passing through the part of the slit plate disposed opposite to the first part.

The present disclosure provides a display panel and a method for manufacturing the same, and a mobile terminal. The display panel comprises: a substrate layer comprising a first part and a second part adjacently disposed, wherein the first part is provided with a plurality of holes, so that an elastic modulus of the first part is less than an elastic modulus of the second part; and a first elastic layer disposed on at least one of a side of the substrate layer away from a light-emitting surface and a side of the substrate layer close to the light-emitting surface. In the present disclosure, a projection of the first elastic layer on the substrate layer covers a boundary line between the first part and the second part, an elastic modulus of the first elastic layer is less than an elastic modulus of the substrate layer, the elastic modulus of the first elastic layer increases in a first direction, and the first direction is a direction from the first part to the second part. Therefore, an elasticity of a region of the display panel corresponding to the first elastic layer increases gradually, which reduces an overall stretchability difference between regions on both sides of the boundary line between the first part and the second part. This reduces a risk of line breaking at the boundary line when the display panel is stretched, thereby improving working reliability of the display panel.

BRIEF DESCRIPTION OF DRAWINGS

Specific implementation of the present disclosure will be described in detail below in conjunction with accompanying drawings to make technical solutions and beneficial effects of the present disclosure obvious.

FIG. 8 is a flowchart of a method for manufacturing the third type of display panel according to an embodiment of the present disclosure.

FIG. 9 is a flowchart of a method for manufacturing the fourth type of display panel according to an embodiment of the present disclosure.

DETAILED DESCRIPTION

Figure 1:
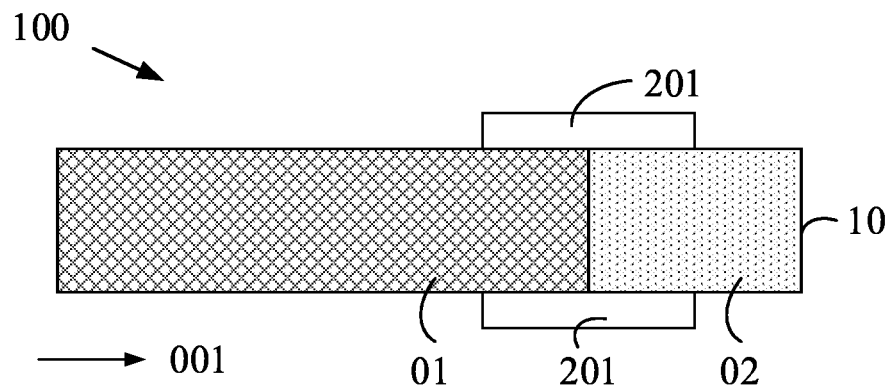
FIG. 1 is a schematic cross-sectional view of a first type of display panel according to an embodiment of the present disclosure.

Technical solutions in embodiments of the present disclosure will be clearly and completely described below in conjunction with accompanying drawings in the embodiments of the present disclosure. It is apparent that the described embodiments are merely a part of the embodiments of the present disclosure and not all embodiments. All other embodiments obtained by those skilled in the art based on the embodiments of the present disclosure without creative labor are within claimed scope of the present disclosure.

In a description of the present disclosure, it should be understood that location or position relationships indicated by terms, such as "on", "under", "opposite to", "close to", and "away from", are location or position relationships based on illustration of the accompanying drawings. The term"on" only indicates that an object is located above another object, specifically indicates that an object is directly above, diagonally above, or at an upper surface of another object, and the two objects may not contact each other. The above location or position relationships are merely used for describing the present disclosure and simplifying the description instead of indicating or implying the indicated apparatuses or elements should have specified locations or be constructed and operated according to specified locations, and therefore, should not be intercepted as limitations to the present disclosure.

In the accompanying drawings, elements with similar structures are indicated by the same reference numerals. References to "embodiment" herein mean that a particular feature, structure, or characteristic described in connection with the embodiments can be included in at least one embodiment of the present disclosure. The appearances of this phrase in various places in the specification are not necessarily all referring to a same embodiment, nor are separate or alternative embodiments mutually exclusive of other embodiments. The embodiments described herein, explicitly and implicitly understood by one skilled in the art, can be combined with other embodiments.

The present disclosure provides a display panel, which comprises, but is not limited to, the following embodiments and combinations thereof.

In an embodiment, as shown in FIGS. 1 to 4, a display panel 100 comprises a substrate layer 10 and one or more first elastic layers 201. The substrate layer 10 comprises a first part 01 and a second part 02. The first part 01 and the second part 02 are adjacently disposed. The first part 01 is provided with a plurality of holes, so that an elastic modulus of the first part 01 is less than an elastic modulus of the second part 02. The first elastic layers 201 are disposed on at least one of a side of the substrate layer 10 away from a light-emitting surface and a side of the substrate layer 10 close to the light-emitting surface. Projections of the first elastic layers 201 on the substrate layer 10 cover a boundary line between the first part 01 and the second part 02. An elastic modulus of the first elastic layers 201 is less than an elastic modulus of the substrate layer 10. The elastic modulus of the first elastic layers 201 increases in a first direction 001. The first direction 001 is a direction from the first part 01 to the second part 02.

Figure 4:
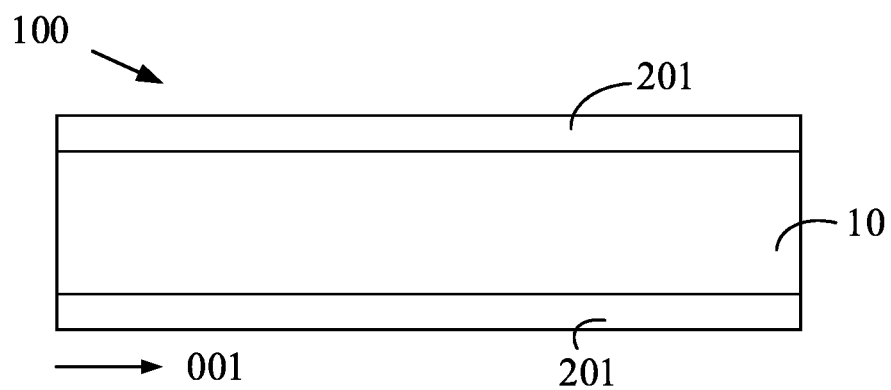
FIG. 4 is a schematic cross-sectional view of a fourth type of display panel according to an embodiment of the present disclosure.
Figure 5:
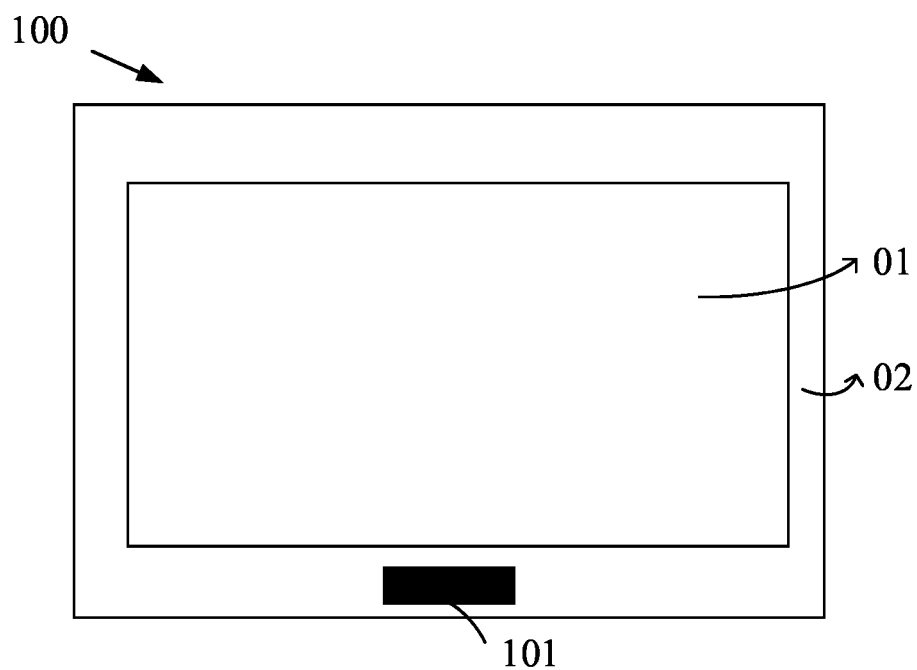
FIG. 5 is a schematic top view of a display panel according to an embodiment of the present disclosure.

Specifically, as shown in FIG. 5, the second part 02 may be arranged around the first part 01. Furthermore, the first part 01 may be configured for screen display, and the second part 02 may be configured to dispose a driving circuit or other electronic devices. The first part 01 may be formed as a display area, and the second part 02 may be formed as a non-display area. Furthermore, a driving device 101 may be disposed on the second part 02 of the substrate layer 10, which can avoid a situation that the driving device 101 is disposed in the display area and affects a display effect, and can avoid a situation that the driving device 101 is disposed on the first part 01 with a smaller elastic modulus and affects a service life of the driving device 101.The driving device 101 may be electrically connected by wires passing through the first part 01 and the second part 02. Specifically, FIG. 1 to FIG. 4 illustrate an example in which the side of the substrate layer 10 away from the light-emitting surface and the side of the substrate layer 10 close to the light-emitting surface are both provided with the first elastic layers 201.

The substrate layer 10 may be made of polyimide, but is not limited thereto. The first part 01 of the substrate layer 10 may be processed to make the first part 01 stretchable and the second part 02 unstretchable. As described above, the first part 01 may be provided with holes. It can be understood that a material of the substrate layer 10 has a relatively high elastic modulus. That is, the second part 02 has a poor elasticity and stretchability. Furthermore, because the first part 01 is provided with the holes, the elastic modulus of the first part 01 is reduced, thereby improving a stretchability of the first part 01. Finally, the first part 01 is stretchable.

It is understandable that the elastic modulus of the first elastic layers 201 is less than the elastic modulus of the substrate layer 10, that is, an elasticity of the first elastic layers 201 is greater than an elasticity of the substrate layer 10. The projections of the first elastic layers 201 on the substrate layer 10 cover the boundary line between the first part 01 and the second part 02, that is, a distribution of an elasticity of a region near the boundary line between the first part 01 and the second part 02 in the display panel 100 is determined by characteristics of the first elastic layers 201. Furthermore, in the present disclosure, the elastic modulus of the first elastic layers 210 increases in the first direction 001, that is, the elasticity of the region near the boundary line between the first part 01 and the second part 02 decreases in the first direction 001.

In the above, in the present disclosure, by disposing the first elastic layers 201 whose elasticity decreases in the first direction 001 and covering the boundary line between the first part 01 and the second part 02, a stretchability of the region near the boundary line between the first part 01 and the second part 02 also decreases in the first direction 001. This avoids an excessively large difference in stretchability of regions on both sides of the boundary line between the first part 01 and the second part 02, which reduces a risk of line breaking at and near the boundary line between the first part 01 and the second part 02 when the display panel 100 is stretched, thereby improving working reliability of the display panel 100. It should be noted that even though the first elastic layers 201 may cover a portion of the second part 02 because the elastic modulus of the second part 02 is relatively high, it can be ensured that the second part 02 is still not stretchable.

Figure 2:
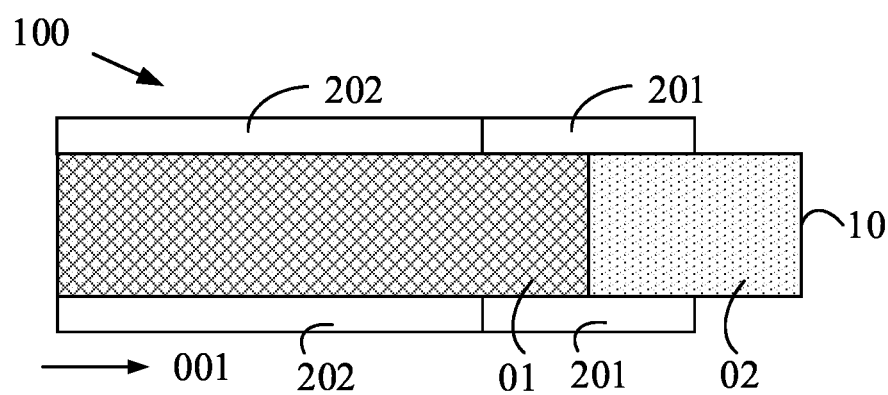
FIG. 2 is a schematic cross-sectional view of a second type of display panel according to an embodiment of the present disclosure.

In an embodiment, as shown in FIG. 2, the display panel 100 further comprises one or more second elastic layers 202. The second elastic layers 202 are disposed on same layers as the first elastic layers 201. The second elastic layers 202 are disposed on sides of the first elastic layers 201 close to a center of the display panel 100. An elastic modulus of the second elastic layers 202 is less than the elastic modulus of the first elastic layers 201, and the elastic modulus of the second elastic layers 202 is equal everywhere.

It is understandable that the first part 01 is stretchable, the elastic modulus of the second elastic layers 202 of the present disclosure is less than the elastic modulus of the first elastic layers 201, and the elastic modulus of the second elastic layers 202 is equal everywhere, so that a stretchability of a region of the display panel 100 covered by the second elastic layers 202 is better than a stretchability of a region of the display panel 100 covered by the first elastic layers 201. Furthermore, in the present disclosure, the elastic modulus of the second elastic layers 202 is equal everywhere, so that an elasticity and the stretchability of the region of the display panel 100 covered by the second elastic layers 202 are equal everywhere, which improves uniformity of the elasticity and the stretchability of the region of the display panel 100 covered by the second elastic layers 202. An elasticity and a stretchability of the second elastic layers 202 may decrease in the first direction 001. Similarly, this can further reduce a risk of line breaking in a region disposed opposite to the first part 01 when the display panel 100 is stretched, thereby further improving the working reliability of the display panel 100. The second elastic layers 202 may correspond to the first elastic layers 201 one-to-one, that is, a region provided with the first elastic layers 201 may also be provided with corresponding second elastic layers 202.

Figure 3:
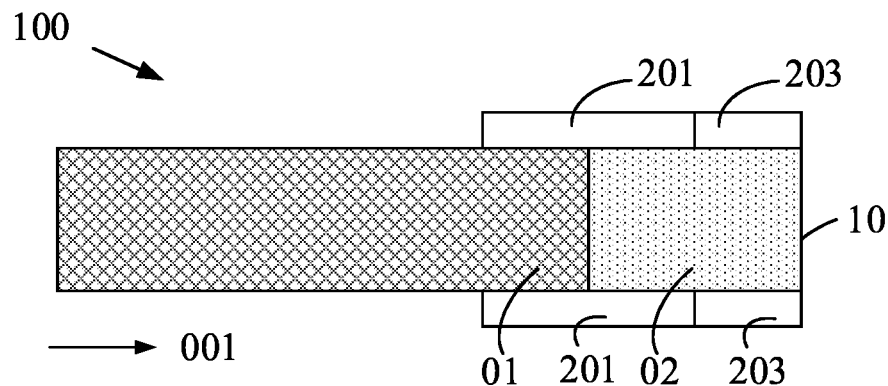
FIG. 3 is a schematic cross-sectional view of a third type of display panel according to an embodiment of the present disclosure.

In an embodiment, as shown in FIG. 3, the display panel 100 further comprises one or more third elastic layers 203. The third elastic layers 203 are disposed on the same layers as the first elastic layers 201. The third elastic layers 203 are disposed on sides of the first elastic layers 201 away from the center of the display panel 100. An elastic modulus of the third elastic layers 203 is greater than the elastic modulus of the first elastic layers 201, and the elastic modulus of the third elastic layers 203 is equal everywhere.

It is understandable that the second part 02 is unstretchable, the elastic modulus of the third elastic layers 203 of the present disclosure is greater than the elastic modulus of the first elastic layers 201, and the elastic modulus of the third elastic layers 203 is equal everywhere, so that a stretchability of a region of the display panel 100 covered by the third elastic layers 203 is worse than the stretchability of the region of the display panel 100 covered by the first elastic layers 201, which further improves a non-stretchability of the region of the display panel 100 covered by the third elastic layers 203. Similarly, the elastic modulus of the third elastic layers 203 is equal everywhere, which further improves uniformity of an elasticity and the stretchability of the region of the display panel 100 covered by the third elastic layers 203. An elasticity and a stretchability of the third elastic layers 203 may decrease in the first direction 001, which can further reduce a risk of line breaking in a region disposed opposite to the second part 02 when the display panel 100 is stretched, thereby further improving the working reliability of the display panel 100. The third elastic layers 203 may correspond to the first elastic layers 201 one-to-one, that is, the region provided with the first elastic layers 201 may also be provided with corresponding third elastic layers 203. The third elastic layers 203, the corresponding first elastic layers 201, and the corresponding second elastic layers 202 may also be disposed in the same layer.

In an embodiment, as shown in FIG. 4, the projections of the first elastic layers 201 on the substrate layer 10 cover the substrate layer 10. It is understandable that in the present disclosure, the first elastic layer 201 is configured such that its projection on the substrate layer 10 covers the substrate layer 10. That is, the first elastic layer 201 may overlap the stretchable first part 01 and the unstretchable second part 02. As described above, the elastic modulus of the first elastic layers 210 increases in the first direction 001, that is, the elastic modulus of the first elastic layers 201 increases gradually.

Specifically, both the first part 01 and the second part 02 may be divided into a plurality of unit regions with a same area. Elastic modules of regions of the display panel 100 corresponding to the unit regions arranged along the first direction 001 increases. Similarly, the basis of reducing the risk of the line breaking at and near the boundary line between the first part 01 and the second part 02 when the display panel 100 is stretched, this can further reduce a risk of line breaking in a region disposed opposite to the first part 01 and a region disposed opposite to the second part 02 when the display panel 100 is stretched, thereby further improving the working reliability of the display panel 100.

In an embodiment, the first elastic layer 201 is made of polydimethylsiloxane. Polydimethylsiloxane is a hydrophobic organic silicone material. Polydimethylsiloxane is also called dimethicone, which has the following chemical properties. Its appearance varies from colorless and transparent volatile liquid to extremely high-viscosity liquid or silica gel depending on its molecular weight. It is odorless and has high transparency. It is heat-resistant and cold-resistant. Its viscosity changes little with temperature. It is waterproof and has low surface tension. It conducts heat, and its thermal conductivity coefficient is 0.134-0.159 W/(m·K). It transmits light, and its light transmittance is 100%. Dimethicone is non-toxic, tasteless, physiologically inert, and has good chemical stability. Specifically, the first elastic layers 201 may be a polydimethylsiloxane film. A main chain of the polydimethylsiloxane film is a molecular structure of silicon-oxygen-silicon. The first elastic layers 201 has characteristics of high temperature resistance, high elasticity, high biocompatibility, and high air permeability.

It should be noted that after the first elastic layers 201 is stretched, as long as it does not break, the first elastic layers 201 will return to its original shape. An elongation of a part with the smallest elastic modulus in the first elastic layers 201 may be 300% to 1000%. It can be understood from the above that the first elastic layer 201 has high temperature resistance and excellent elasticity, and the elastic modulus of the first elastic layers 201 is less than the elastic modulus of the substrate layer 10. Furthermore, the second elastic layer 202 and the third elastic layer 203 may also be made of polydimethylsiloxane.

The present disclosure further provides a mobile terminal. The mobile terminal comprises a terminal main body part and any display panel as described above. The terminal main body part and the display panel are combined into one body.

The present disclosure provides a method for manufacturing a display panel, which comprises, but is not limited to, the following embodiments and combinations thereof.

Figure 6:
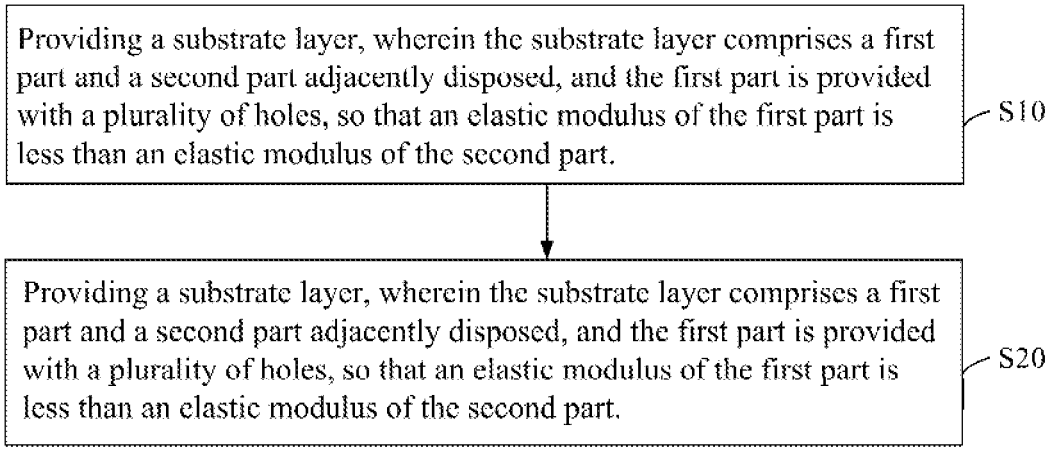
FIG. 6 is a flowchart of a method for manufacturing the first type of display panel according to an embodiment of the present disclosure.
Figure 10:
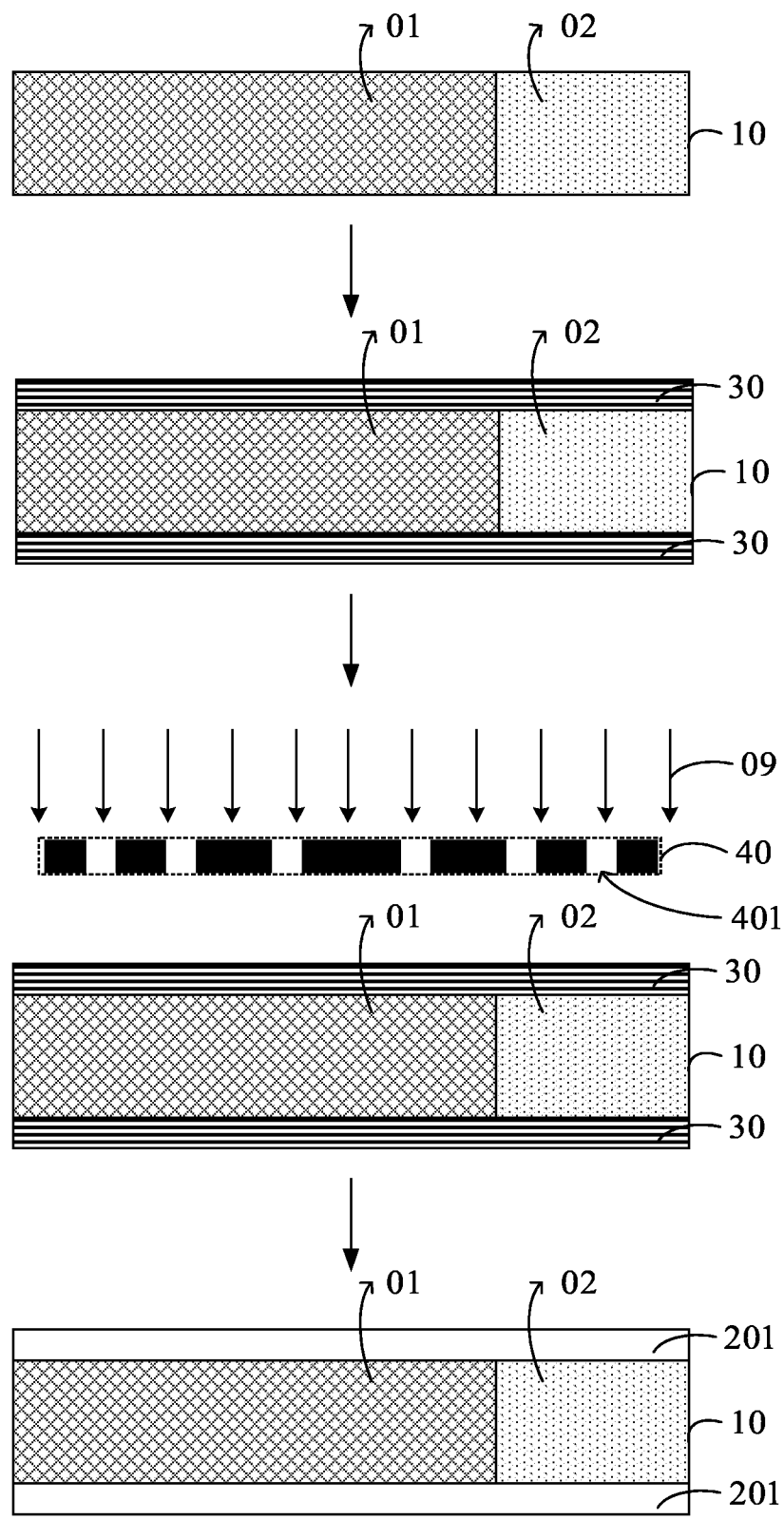
FIG. 10 is a schematic flowchart of a method for manufacturing a display panel according to an embodiment of the present disclosure.
Figure 11:
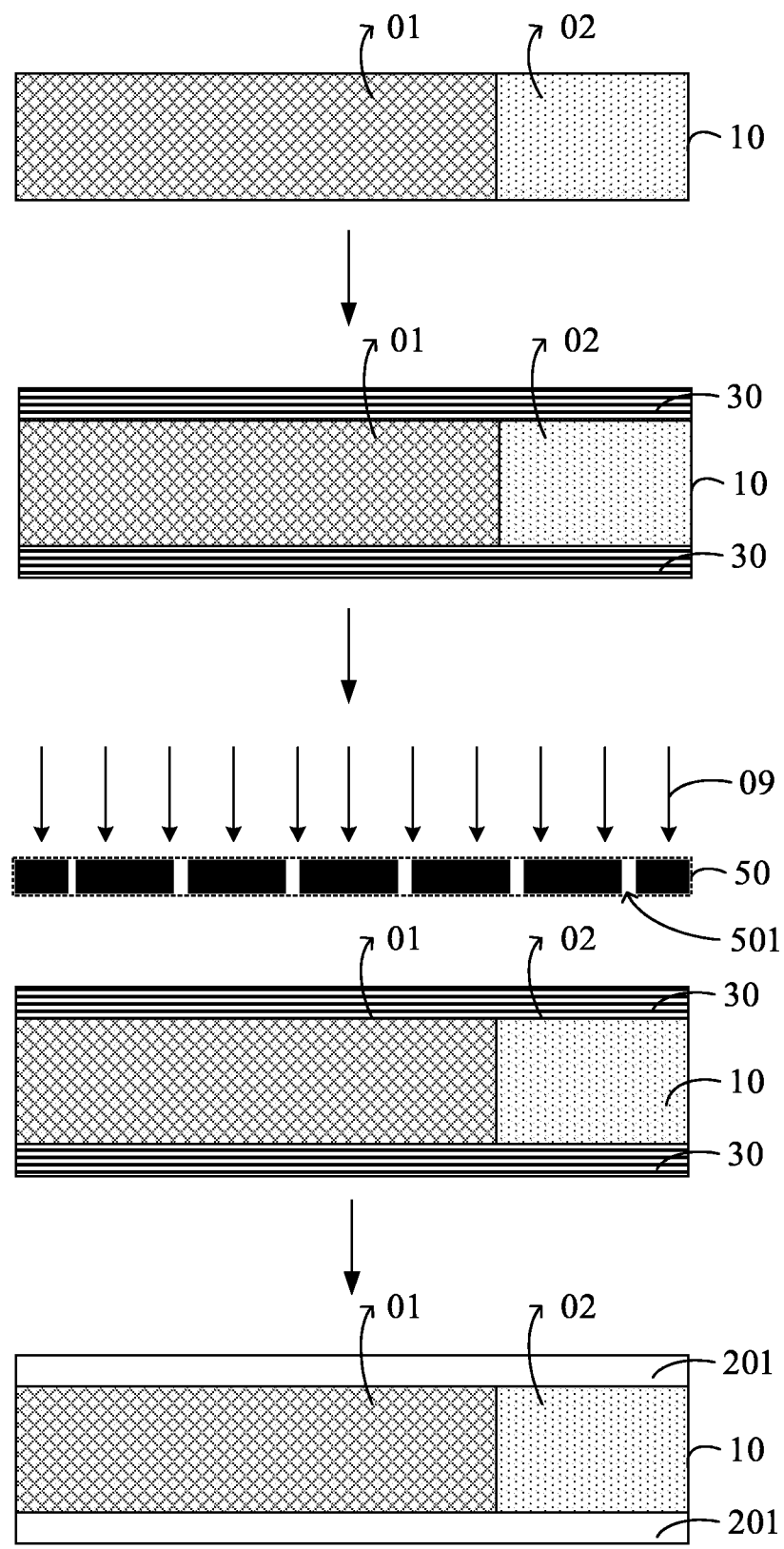
FIG. 11 is a schematic flowchart of another method for manufacturing a display panel according to an embodiment of the present disclosure.

In an embodiment, as shown in FIG. 6, FIG. 10, and FIG. 11, the method for manufacturing the display panel comprises, but is not limited to, the following steps.

S10: providing a substrate layer, wherein the substrate layer comprises a first part and a second part adjacently disposed, and the first part is provided with a plurality of holes, so that an elastic modulus of the first part is less than an elastic modulus of the second part.

Specifically, please refer to FIG. 10 and FIG. 11. For the substrate layer 10, the first part 01, and the second part 02, reference may be made to FIG. 1 to FIG. 5 and related descriptions above.

The substrate layer 10 may be made by the following steps: coating polyimide on a glass substrate to form a polyimide film, and drying the polyimide film to form the substrate layer 10. Furthermore, a thin film transistor layer and a light-emitting layer may be sequentially formed on the substrate layer 10. The thin film transistor layer comprises a plurality of thin film transistors. The light-emitting layer may comprise a plurality of organic light-emitting semiconductors formed by an evaporation process, or a micro light-emitting diode array formed by a transfer and binding process. When the light-emitting layer comprises the organic light-emitting semiconductors, an encapsulation layer is formed on the light-emitting layer. The substrate layer 10 is peeled from the glass substrate by a laser lift-off process, so that the substrate layer 10 and layers disposed on the substrate layer 10 are separated from the glass substrate.

S20: forming a first elastic layer on at least one of a side of the substrate layer away from a light-emitting surface and a side of the substrate layer close to the light-emitting surface, wherein a projection of the first elastic layer on the substrate layer covers a boundary line between the first part and the second part, an elastic modulus of the first elastic layer is less than an elastic modulus of the substrate layer, the elastic modulus of the first elastic layer increases in a first direction, and the first direction is a direction from the first part to the second part.

Specifically, please refer to FIG. 10 and FIG. 11. For the first elastic layer 201 and the boundary line between the first part 01 and the second part 02, reference may be made to FIG. 1 to FIG. 4 and related descriptions above. In the present disclosure, by disposing the first elastic layers 201 whose elasticity decreases in the first direction 001 and whose projection on the substrate layer 10 covers the boundary line between the first part 01 and the second part 02, the stretchability of the region near the boundary line between the first part 01 and the second part 02 also decreases in the first direction 001. This avoids the excessively large difference in the stretchability of the regions on both sides of the boundary line between the first part 01 and the second part 02, which reduces the risk of the line breaking at and near the boundary line between the first part 01 and the second part 02 when the display panel 100 is stretched, thereby improving the working reliability of the display panel 100.

Figure 7:
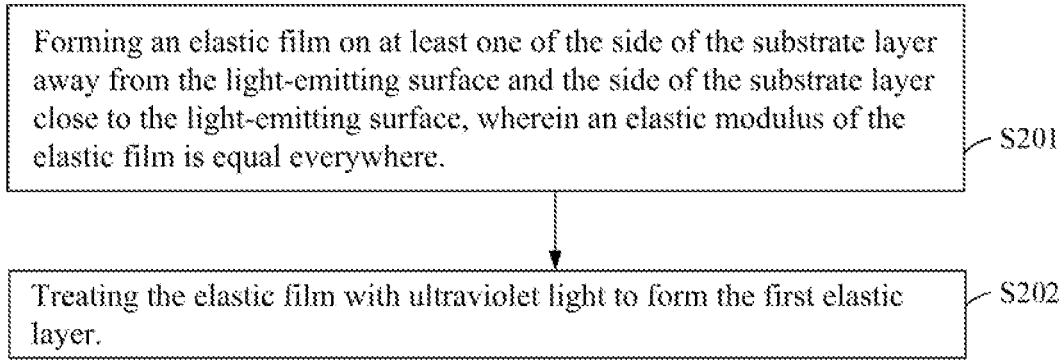
FIG. 7 is a flowchart of a method for manufacturing the second type of display panel according to an embodiment of the present disclosure.

In an embodiment, as shown in FIG. 7, FIG. 10, and FIG. 11, the forming the first elastic layer on at least one of the side of the substrate layer away from the light-emitting surface and the side of the substrate layer close to the light-emitting surface may comprise, but is not limited to, the following steps.

S201: forming an elastic film on at least one of the side of the substrate layer away from the light-emitting surface and the side of the substrate layer close to the light-emitting surface, wherein an elastic modulus of the elastic film is equal everywhere.

Please refer to FIG. 10 and FIG. 11, elastic layers 30 may be a polydimethylsiloxane film whose elastic modulus is equal everywhere. According to the above, it can be understood that the elastic layers 30 may have high temperature resistance and excellent elasticity, and an elastic modulus of the elastic layers 30 is less than the elastic modulus of the substrate layer Specifically, one or more of the elastic layers 30 may be directly attached to at least one of the side of the substrate layer 10 away from the light-emitting surface and the side of the substrate layer 10 close to the light-emitting surface. FIG. 10 and FIG. 11 illustrate an example in which the elastic layers 30 cover an upper surface and a lower surface of the substrate layer 10.

S202: treating the elastic film with ultraviolet light to form the first elastic layer.

It is understandable that the elastic layers 30 may be treated with ultraviolet light 09 to change the elastic modulus of the elastic layers 30. Furthermore, by controlling total irradiation amounts of the ultraviolet light 09 in different regions of the elastic layers 30, elastic modulus of the different regions of the elastic layers 30 can be set to be different, so that the formed first elastic layers 201 conforms to that the elastic modulus of the first elastic layers 201 increase in the first direction. The ultraviolet light 09 may have a wavelength of 100 nm to 280 nm. Further, the ultraviolet light 09 may have a wavelength of 254 nm.

In an embodiment, as shown in FIG. 8 and FIG. 10, the treating the elastic film with the ultraviolet light to form the first elastic layer may comprise, but is not limited to, the following steps.

S2021: disposing a photomask opposite to the elastic film, wherein the photomask is provided with a plurality of hollow areas, and an area ratio of the hollow areas in a part of the photomask disposed opposite to the second part is greater than an area ratio of the hollow areas in a part of the photomask disposed opposite to the first part.

It can be understood that, as shown in FIG.10, a photomask 40 is provided with a non-hollow area between every two adjacent hollow areas 401. Specifically, in the first direction, sizes of the hollow areas may increase, or sizes of the non-hollow areas may decrease. Total irradiation amounts of the ultraviolet light 09 in regions of the elastic layers 30 determine elastic modulus of corresponding regions of the first elastic layers 201. A plurality of regions of the elastic layers 30 corresponding to the hollow regions 401 are irradiated with the ultraviolet light 09 to change their elastic modulus. Herein, description is made by taking as an example that an elastic modulus of each region of the first elastic layers 201 is positively correlated with a total irradiation amount of the ultraviolet light 09 in a corresponding region of the elastic layers 30. That is, the greater the total irradiation amount of the ultraviolet light 09, the greater the elastic modulus of the corresponding region of the formed first elastic layer 201.

Specifically, the sizes of the hollow areas 401 in the first direction may be same or different, and the sizes of the non-hollow areas in the first direction may be same or different, as long as an area ratio of the hollow areas 401 in a portion of the photomask 40 close to the second part 02 is greater than an area ratio of the hollow areas 401 in a portion of the photomask 40 close to the first part 01. FIG. 10 illustrates an example in which the sizes of the hollow areas 401 in the first direction are same, and the sizes of the non-hollow areas in the first direction decrease.

S2022: irradiating the elastic film with the ultraviolet light through the photomask to form the first elastic layer.

It is understandable that, as shown in FIG. 10, the ultraviolet light 09 can pass through each of the hollow areas 401 of the photomask 40 and regions not covered by the photomask 40 to irradiate corresponding regions of the elastic layers 30. Two opposite sides of the photomask 40 may be located within two boundaries of the display panel, so that regions of the display panel close to the two boundaries are irradiated by the ultraviolet light 09 and has a larger elastic modulus.

In an embodiment, as shown in FIG. 9 and FIG. 11, the treating the elastic film with the ultraviolet light to form the first elastic layer may comprise, but is not limited to, the following steps.

S2023: disposing a slit plate opposite to the elastic film, wherein the slit plate is provided with a plurality of slits evenly distributed.

Specifically, as shown in FIG. 11, sizes of slits 501 of a slit plate 50 may be same, and distances between two adjacent slits 501 may be same.

S2024: irradiating the elastic film with the ultraviolet light through the slit plate to form the first elastic layer, wherein an irradiation time of the ultraviolet light passing through a part of the slit plate disposed opposite to the second part is greater than an irradiation time of the ultraviolet light passing through a part of the slit plate disposed opposite to the first part, or an irradiation intensity of the ultraviolet light passing through the part of the slit plate disposed opposite to the second part is greater than an irradiation intensity of the ultraviolet light passing through the part of the slit plate disposed opposite to the first part.

Specifically, an irradiation time or intensity of the ultraviolet light 09 irradiated to the different slits 501 can be controlled herein to control total irradiation amounts of the ultraviolet light 09 irradiated to the different slits 501 to be different. Similarly, as shown in FIG. 11, the ultraviolet light 09 can pass through each of the slits 501 of the slit plate 50 to irradiate corresponding regions of the elastic layers 30.

The present disclosure provides a display panel and a method for manufacturing the same, and a mobile terminal. The display panel comprises: a substrate layer comprising a first part and a second part adjacently disposed, wherein the first part is provided with a plurality of holes, so that an elastic modulus of the first part is less than an elastic modulus of the second part; and a first elastic layer disposed on at least one of a side of the substrate layer away from a light-emitting surface and a side of the substrate layer close to the light-emitting surface. In the present disclosure, a projection of the first elastic layer on the substrate layer covers a boundary line between the first part and the second part, an elastic modulus of the first elastic layer is less than an elastic modulus of the substrate layer, the elastic modulus of the first elastic layer increases in a first direction, and the first direction is a direction from the first part to the second part. Therefore, an elasticity of a region of the display panel corresponding to the first elastic layer increases gradually, which reduces an overall stretchability difference between regions on both sides of the boundary line between the first part and the second part. This reduces a risk of line breaking at the boundary line when the display panel is stretched, thereby improving working reliability of the display panel.

The display panel and the method for manufacturing the same, and the mobile terminal provided by the embodiments of the present disclosure are described in detail above. The present disclosure uses specific examples to describe principles and embodiments of the present application. The above description of the embodiments is only for helping to understand the technical solutions of the present disclosure and its core ideas. It should be understood by those skilled in the art that they can modify the technical solutions recited in the foregoing embodiments, or replace some of technical features in the foregoing embodiments with equivalents. These modifications or replacements do not cause essence of corresponding technical solutions to depart from the scope of the technical solutions of the embodiments of the present disclosure.

What is claimed is:

1. A display panel, comprising:
   a substrate layer comprising a first part and a second part adjacently disposed, wherein the first part is provided with a plurality of holes, so that an elastic modulus of the first part is less than an elastic modulus of the second part; and
   a first elastic layer disposed on at least one of a surface of the substrate layer away from a light-emitting surface and a surface of the substrate layer close to the light-emitting surface,
   wherein a projection of the first elastic layer on the substrate layer covers a boundary line between the first part and the second part, a maximum elastic modulus of the first elastic layer is less than an elastic modulus of the first part of the substrate layer, the elastic modulus of the first elastic layer increases in a first direction, and the first direction is a direction from the first part to the second part.

2. The display panel according to claim 1, further comprising:
   a second elastic layer disposed on a same layer as the first elastic layer, and on a side of the first elastic layer close to a center of the display panel, wherein an elastic modulus of the second elastic layer is less than a minimum elastic modulus of the first elastic layer, and the elastic modulus of the second elastic layer is equal everywhere.

3. The display panel according to claim 1, further comprising:
   a third elastic layer disposed on a same layer as the first elastic layer, and on a side of the first elastic layer away from a center of the display panel, wherein an elastic modulus of the third elastic layer is greater than the maximum elastic modulus of the first elastic layer, and the elastic modulus of the third elastic layer is equal everywhere.

4. The display panel according to claim 1, wherein the projection of the first elastic layer on the substrate layer covers the substrate layer.

5. The display panel according to claim 1, wherein the first elastic layer is made of polydimethylsiloxane.

6. The display panel according to claim 1, wherein the first part is configured for screen display, and the second part is configured to dispose a driving circuit.

7. The display panel according to claim 1, wherein the substrate layer is made of polyimide.

8. A mobile terminal, comprising a terminal main body part and a display panel integrated with the terminal main body part wherein the display panel comprises:
   a substrate layer comprising a first part and a second part adjacently disposed, wherein the first part is provided with a plurality of holes, so that an elastic modulus of the first part is less than an elastic modulus of the second part; and
   a first elastic layer disposed on at least one of a surface of the substrate layer away from a light-emitting surface and a surface of the substrate layer close to the light-emitting surface, wherein a projection of the first elastic layer on the substrate layer covers a boundary line between the first part and the second part, a maximum elastic modulus of the first elastic layer is less than an elastic modulus of the first part of the substrate layer, the elastic modulus of the first elastic layer increases in a first direction, and the first direction is a direction from the first part to the second part.

9. The mobile terminal according to claim 8, wherein the display panel further comprises:
   a second elastic layer disposed on a same layer as the first elastic layer, and on a side of the first elastic layer close to a center of the display panel, wherein an elastic modulus of the second elastic layer is less than a minimum elastic modulus of the first elastic layer, and the elastic modulus of the second elastic layer is equal everywhere.

10. The mobile terminal according to claim 8, wherein the display panel further comprises:
    a third elastic layer disposed on a same layer as the first elastic layer, and on a side of the first elastic layer away from a center of the display panel, wherein an elastic modulus of the third elastic layer is greater than the maximum elastic modulus of the first elastic layer, and the elastic modulus of the third elastic layer is equal everywhere.

11. The mobile terminal according to claim 8, wherein the projection of the first elastic layer on the substrate layer covers the substrate layer.

12. The mobile terminal according to claim 8, wherein the first elastic layer is made of polydimethylsiloxane.

13. The mobile terminal according to claim 8, wherein the first part is configured for screen display, and the second part is configured to dispose a driving circuit.

14. The mobile terminal according to claim 8, wherein the substrate layer is made of polyimide.

15. A method for manufacturing a display panel, comprising:
- providing a substrate layer, wherein the substrate layer comprises a first part and a second part adjacently disposed, and the first part is provided with a plurality of holes, so that an elastic modulus of the first part is less than an elastic modulus of the second part; and
- forming a first elastic layer on at least one of a surface of the substrate layer away from a light-emitting surface and a surface of the substrate layer close to the light-emitting surface, wherein a projection of the first elastic layer on the substrate layer covers a boundary line between the first part and the second part, a maximum elastic modulus of the first elastic layer is less than an elastic modulus of the first part of the substrate layer, the elastic modulus of the first elastic layer increases in a first direction, and the first direction is a direction from the first part to the second part.

16. The method for manufacturing the display panel according to claim 15, wherein the providing the substrate layer comprises:
- coating polyimide on a glass substrate to form a polyimide film; and
- drying the polyimide film to form the substrate layer.

17. The method for manufacturing the display panel according to claim 15, wherein the forming the first elastic layer on at least one of the side of the substrate layer away from the light-emitting surface and the side of the substrate layer close to the light-emitting surface comprises:
- forming an elastic film on at least one of the side of the substrate layer away from the light-emitting surface and the side of the substrate layer close to the light-emitting surface, wherein an elastic modulus of the elastic film is equal everywhere; and
- treating the elastic film with ultraviolet light to form the first elastic layer.

18. The method for manufacturing the display panel according to claim 17, wherein the treating the elastic film with the ultraviolet light to form the first elastic layer comprises:
- disposing a photomask opposite to the elastic film, wherein the photomask is provided with a plurality of hollow areas, and an area ratio of the hollow areas in a part of the photomask disposed opposite to the second part is greater than an area ratio of the hollow areas in a part of the photomask disposed opposite to the first part; and
- irradiating the elastic film with the ultraviolet light through the photomask to form the first elastic layer.

19. The method for manufacturing the display panel according to claim 18, wherein
- the photomask is provided with a non-hollow area between every two adjacent hollow areas; and
- in the first direction, sizes of the hollow areas increase, or sizes of the non-hollow areas decrease.

20. The method for manufacturing the display panel according to claim 17, wherein the treating the elastic film with the ultraviolet light to form the first elastic layer comprises:
- disposing a slit plate opposite to the elastic film, wherein the slit plate is provided with a plurality of slits evenly distributed; and
- irradiating the elastic film with the ultraviolet light through the slit plate to form the first elastic layer, wherein an irradiation time of the ultraviolet light passing through a part of the slit plate disposed opposite to the second part is greater than an irradiation time of the ultraviolet light passing through a part of the slit plate disposed opposite to the first part, or an irradiation intensity of the ultraviolet light passing through the part of the slit plate disposed opposite to the second part is greater than an irradiation intensity of the ultraviolet light passing through the part of the slit plate disposed opposite to the first part.

* * * * *